United States Patent [19]

Seidel

[11] Patent Number: 5,218,172
[45] Date of Patent: Jun. 8, 1993

[54] METALLIZED FRAME WHICH INTERCONNECTS ETCHED WIRINGS FOR INTEGRATED CIRCUITS

[75] Inventor: Wolfgang Seidel, Munich, Fed. Rep. of Germany

[73] Assignee: Siemens Nixdorf Informationssysteme AG, Fed. Rep. of Germany

[21] Appl. No.: 731,653

[22] Filed: Jul. 17, 1991

[30] Foreign Application Priority Data

Jul. 23, 1990 [DE] Fed. Rep. of Germany ....... 4023385

[51] Int. Cl.⁵ .............................................. H05K 1/00
[52] U.S. Cl. .................... 174/268; 361/421; 29/847
[58] Field of Search ................ 174/254, 268; 361/421, 361/398; 29/847, 846

[56] References Cited

U.S. PATENT DOCUMENTS 3,440,027  4/1969  Hugle .............................. 174/254 X
3,821,847  7/1974  Melse et al. ...................... 29/846 X
4,631,100  12/1986  Pellegrino ........................ 29/847 X Primary Examiner—Leo P. Picard
Assistant Examiner—Cheryl R. Figlin
Attorney, Agent, or Firm—Hill, Steadman & Simpson

[57] ABSTRACT

The invention is directed to an etched wiring (spider) for integrated circuits having a metallic frame for electrodeposition and shorting purposes proceeding all around at the periphery and connecting the wiring at several points. When separating a plurality of circuits lying side-by-side after the electrodeposition, an entire strip of the carrier material previously had to be discarded in order to enable the short-free separation of the etched wirings. In order to avoid this waste, the invention provides that the leads to the junctions of the frame with the wiring of neighboring circuits be fashioned meander-like.

1 Claim, 1 Drawing Sheet

METALLIZED FRAME WHICH INTERCONNECTS ETCHED WIRINGS FOR INTEGRATED CIRCUITS

BACKGROUND OF THE INVENTION

This invention is directed to an etched wiring (spider) for integrated circuits, particularly film mounted integrated circuits, comprising a metallic frame for electroplating and shorting purposes that proceeds around the periphery and is connected to the etched wiring at several points.

A cathode terminal in the form of an electrodeposition frame is required to electrodeposit gold on etched wirings, such as, for example, spiders in film mounting, using band-automated bonding techniques. This frame simultaneously short circuits all lines and must in turn be separated after the manufacture of the printed circuit.

German Patent 32 34 745 discloses such a frame. This frame serves particularly therein as a short-circuit frame in order to avoid electrostatic charging during the transport of film-mounted integrated circuits. The separating of such frames from the etched wirings, such as, for example, spiders of film mounting, ensues after the gold-plating in such a fashion that a separation of the film band having the length of a conveying perforation division (approximately 4 mm) is cut off and discarded between two circuits. Material amounting to 10% of the area of the carrier material, such as, for example, the film, is therefore discarded.

SUMMARY OF THE INVENTION

It is therefore an object of the present invention to reduce the waste of carrier material in the etched wiring (spider) for integrated circuits.

In order to achieve this object, the frame for electrodeposition and shorting purposes is fashioned in a way which the etched wirings for integrated circuits are interconnected with meander-like leads between the connecting points of the frame and the wiring of neighboring circuits.

As a result of these measures, the neighboring, integrated circuits can be separated without cutting a substantial amount of carrier material. The meander-like leads between neighboring circuits are thereby designed so that all short-circuit connections can be separated with one cut.

DESCRIPTION OF THE PREFERRED EMBODIMENT

Figure 1:
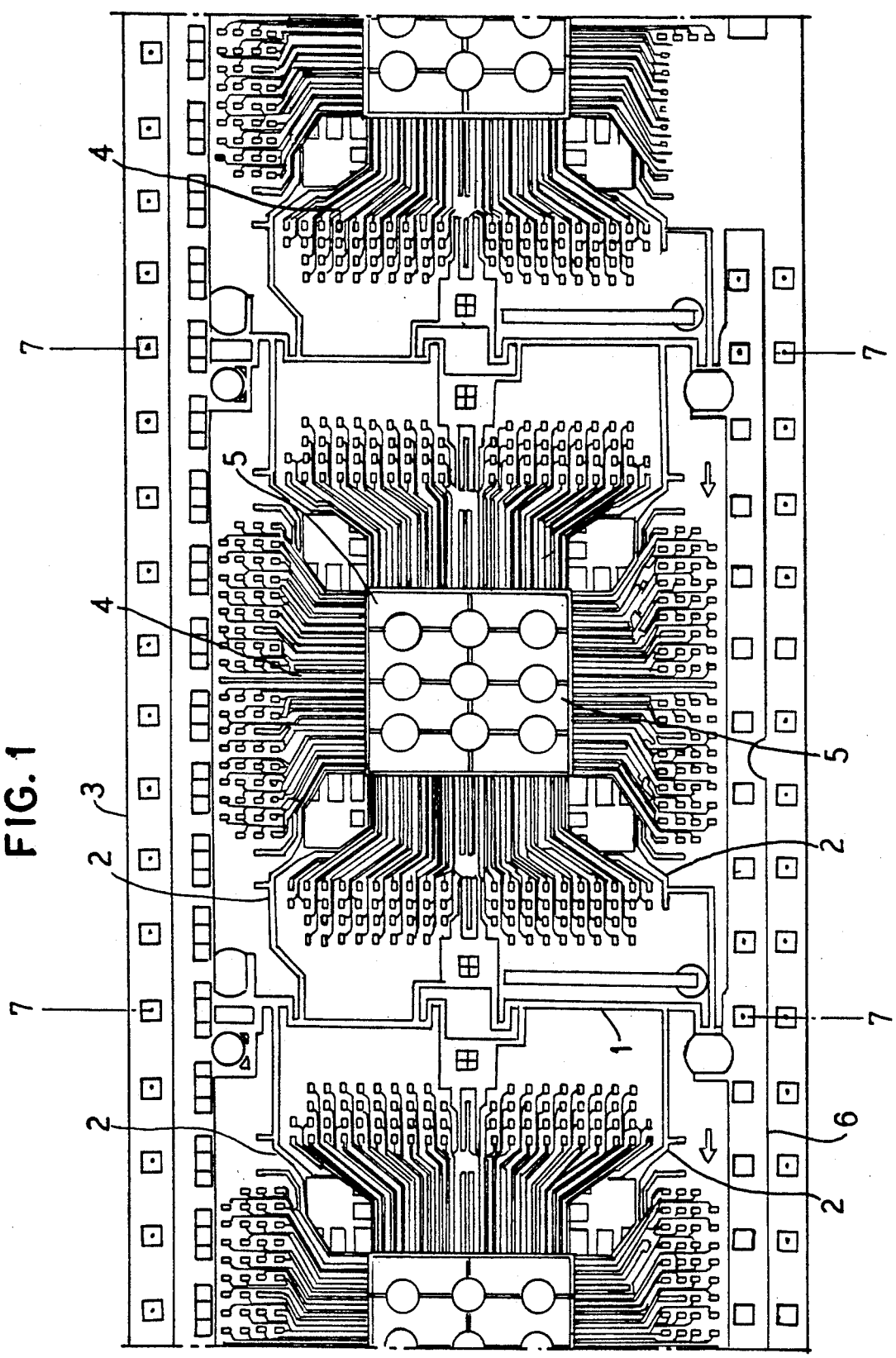
FIG. 1 shows a film strip with a plurality of etched wirings to be connected by the leads of the present invention.

The invention shall be set forth in greater detail with reference to the exemplary embodiment of FIG. 1. FIG. 1 shows a plurality of etched wirings 4 arranged side-by-side on a film strip 3, whereby the interconnections of the etched wiring meet in the center of the wiring at the location where the integrated circuit is to be placed after the metallized spot 5 is cut out. Each of the aforementioned components is well known in the art and merely establish the components which are interconnected to the lead 1 of the instant invention.

An electrodeposition frame is composed of the leads 1 connected between junctions 2 which connect the plurality of etched wirings 4 with a metallized perforation strip 6 at opposite sides of the plurality of etched wirings 4. The leads 1 that lie between the junctions 2 of the etched wirings 4 are thereby fashioned meander-like such that, at various locations between the plurality of etched wirings 4, the etched wirings 4 can be separated from the leads 1 at lines of separation 7 with one cut.

The meandering of the leads of the present invention are in the shape of a hook. The lead 1 begins at the junction 2 and forms a hook-shape at its end near the line of separation 7. Adjacent etched wirings 4 each have leads 1 which meet at the line of separation 7 which permits the etched wirings 4 to be separated from each other with one cut.

Although various minor changes and modifications might be proposed by those skilled in the art, it will be understood that I wish to include within the claims of the patent warranted hereon all such changes and modifications as reasonably come within my contribution to the art.

I claim as my invention:

1. A plurality of etched wiring for film-mounted integrated circuits, comprising:
    metallized strips which proceed substantially parallel around two opposite sides of each of said wirings mounted on a substance and which electrically connect to each of said wirings at a plurality of junctions; and
    leads for supplying an electroplating voltage from the metallized strips which are substantially perpendicular to said metallized strips interconnecting the junctions of neighboring wirings at a line of separation wherein the leads are fashioned meander-like in substantially opposing U-shaped configurations about said line separation such that adjacent etched wirings can be separated from each other with one cut at said line of separation.

* * * * *